(12) United States Patent
Hoyte et al.

(10) Patent No.: US 7,423,433 B2
(45) Date of Patent: Sep. 9, 2008

(54) METHOD AND SYSTEM FOR MULTI-FREQUENCY INDUCTIVE RATIO MEASUREMENT

(75) Inventors: Scott Mordin Hoyte, Carson City, NV (US); Richard Dale Slates, Minden, NV (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/435,646

(22) Filed: May 17, 2006

(65) Prior Publication Data
US 2006/0220655 A1   Oct. 5, 2006

Related U.S. Application Data

(62) Division of application No. 10/722,771, filed on Nov. 26, 2003, now Pat. No. 7,068,041.

(51) Int. Cl.
*G01R 31/08* (2006.01)
*G01R 31/02* (2006.01)

(52) U.S. Cl. .................. 324/525; 324/649; 324/539
(58) Field of Classification Search ............... 324/525, 324/654, 512, 649, 643, 539
See application file for complete search history.

(56) References Cited

U.S. PATENT DOCUMENTS

| 4,303,885 | A | | 12/1981 | Davis et al. |
|---|---|---|---|---|
| 4,467,281 | A | | 8/1984 | Davis et al. |
| 4,652,822 | A | | 3/1987 | Wallace |
| 5,182,513 | A | | 1/1993 | Young et al. |
| 5,410,488 | A | * | 4/1995 | Andersen, III ............... 702/158 |
| 5,420,507 | A | * | 5/1995 | Laskowski .................. 324/236 |
| 5,541,510 | A | * | 7/1996 | Danielson .................... 324/233 |
| 6,040,694 | A | | 3/2000 | Becker |
| 6,281,685 | B1 | * | 8/2001 | Tuttle ......................... 324/529 |
| 6,288,536 | B1 | | 9/2001 | Mandl et al. |
| 6,346,807 | B1 | * | 2/2002 | Slates .................... 324/207.16 |
| 6,479,990 | B2 | * | 11/2002 | Mednikov et al. ........... 324/225 |
| 6,534,996 | B1 | * | 3/2003 | Amrany et al. .............. 324/533 |
| 7,068,041 | B2 | | 6/2006 | Hoyte et al. |

* cited by examiner

*Primary Examiner*—Diego Gutierrez
*Assistant Examiner*—John Zhu
(74) *Attorney, Agent, or Firm*—Armstrong Teasdale LLP

(57) ABSTRACT

A method of testing a cable is provided. The method includes measuring at least one inductive ratio for the cable, determining an inductive gap from the at least one inductive ratio, measuring a parallel impedance of the cable, and determining a resistance of the cable based on the inductive gap and the parallel impedance.

12 Claims, 4 Drawing Sheets

METHOD AND SYSTEM FOR MULTI-FREQUENCY INDUCTIVE RATIO MEASUREMENT

CROSS-REFERENCE TO RELATED APPLICATIONS

This application is a divisional of U.S. patent application Ser. No. 10/722,771, filed Nov. 26, 2003, now U.S. Pat. No. 7,068,041, which is hereby incorporated by reference and is assigned to assignee of the present invention.

BACKGROUND OF THE INVENTION

The present invention relates generally to a digital impedance measurement system and, in particular, to a digital eddy current system used to facilitate measuring inductive ratios.

At least some known rotatable machines are monitored for a vibration using sensors that measure a change in displacement from a fixed position to a target fixed to a rotating member and/or from the rotating member itself. The sensors may be excited by conditioning circuitry to develop an output that is relative to a displacement and/or vibratory response of the target. The conditioning circuitry may be located remotely from the machine and sensor, and coupled to the sensor through one or more cables coupled together in series. At least some known systems include eddy current transducers to monitor proximity of a target to the transducer. The transducer is excited by the conditioning circuitry to interact with the target and such interaction causes a change in the electrical impedance of the transducer. The conditioning circuitry senses the change in electrical impedance and converts the change into a respective displacement and/or vibration output. The electrical impedance measured at the conditioning circuitry is the electrical combination of the target, the transducer including an integral sensing coil and cable, an extension cable and the conditioning circuitry. This impedance is usually called the "Tank Impedance" or parallel impedance (Zp).

Because the indicated gap between the transducer and the target is based upon the parallel impedance as sensed by the conditioning circuitry, any change that modifies the impedance of the transducer and/or cable as sensed by the conditioning circuitry may cause a false gap and/or vibration output from the system. For example, a change in the impedance of the transducer or of the cable connecting the transducer to the conditioning circuitry, may be due to factors not related to the gap, such as, wetting of the cable or transducer by water or another fluid. A fluid leaking into the cable or transducer may cause a change in the resistance and/or reactance of the transducer and/or cable. It would be advantageous to replace such cables and/or transducers. However, it may be impracticable due to machine operational commitments or the cable being located in a relatively extreme environment.

BRIEF DESCRIPTION OF THE INVENTION

In one aspect, a method of testing a cable is provided. The method includes measuring at least one inductive ratio for the cable, determining an inductive gap from the at least one inductive ratio, measuring a parallel impedance of the cable, and determining a resistance of the cable based on the inductive gap and the parallel impedance.

In another aspect, a system for testing a cable is provided. The system includes an eddy current transducer positioned in radio frequency (RF) communication with a target wherein the transducer is configured to generate an output signal relative to a gap distance, and a digital impedance measurement system configured to receive the output signal through a cable that is coupled in series with the transducer, the system is further configured to measure an inductive ratio for the cable and transducer series combination at each of at least one predetermined frequency wherein the system comprises a memory that includes information that is relative to an inductive gap measurement and a parallel impedance gap measurement.

DETAILED DESCRIPTION OF THE INVENTION

Figure 1:
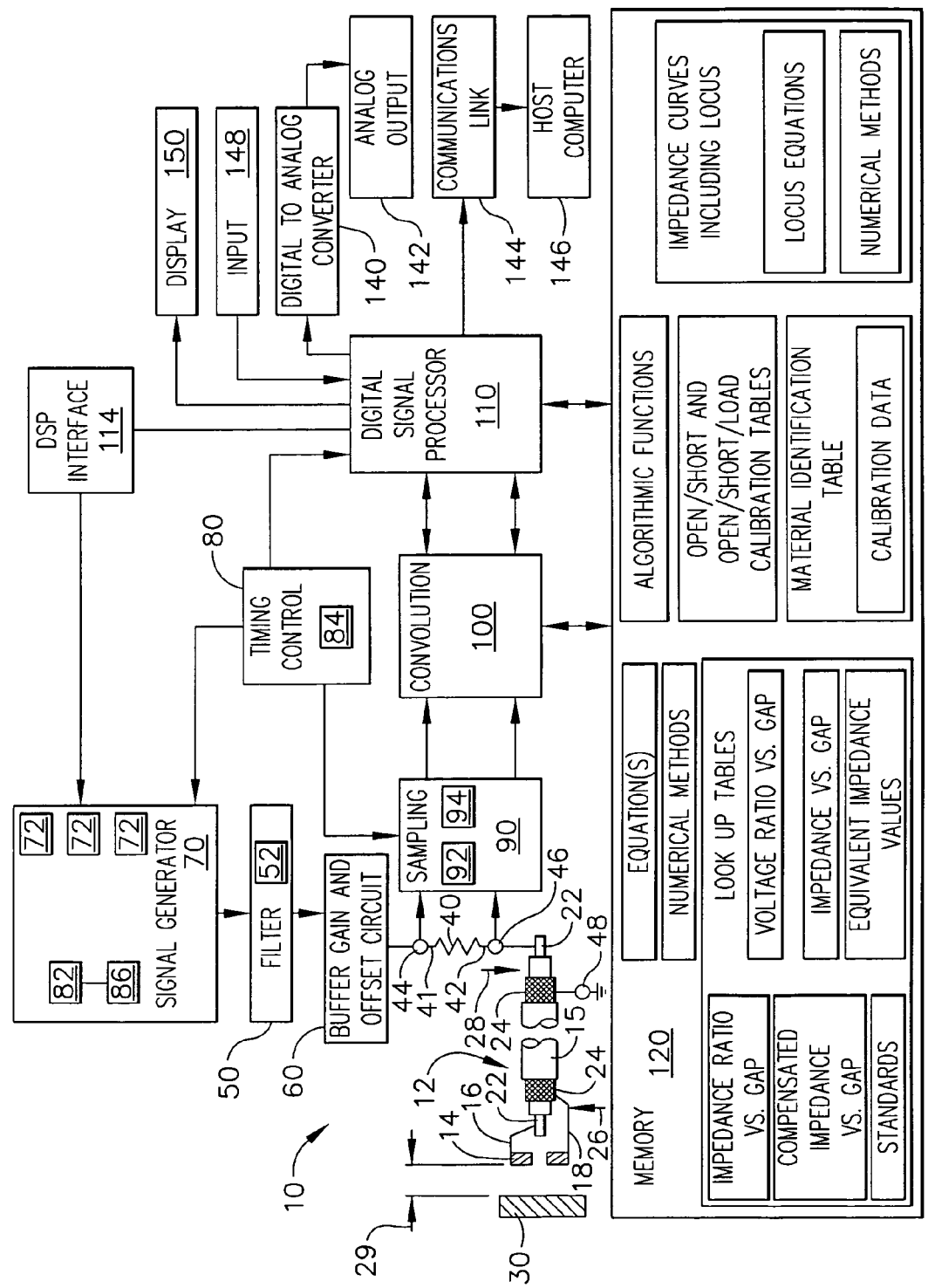
FIG. 1 is a schematic block diagram of an exemplary digital eddy current system.

FIG. 1 is a schematic block diagram of an exemplary digital eddy current system 10 that includes a transducer 12 operatively coupled to system 10. System 10 includes a voltage ratio method (VR method) used for digitally measuring an unknown electrical impedance of transducer 12. Transducer 12 includes an integral sensing element or coil 14 and a multi-conductor transducer cable 15. Sensing element 14 includes a first electrical lead 16 and a second electrical lead 18. Transducer cable 15 includes a first conductor 22 and a second conductor 24 extending from a first end 26 to a second end 28 of transducer cable 15.

At cable first end 26, first conductor 22 and second conductor 24 are each operatively coupled to the first electrical lead 16 and second electrical lead 18 of sensing element 14, respectively. At cable second end 28, first conductor 22 is coupled to second terminal 42 of resistor 40 at node 46 and second conductor 24 is coupled to ground node 48, thereby grounding one lead of the unknown dynamic transducer impedance $Z_{unknown}$.

In the exemplary embodiment, transducer 12 is coupled to a machine for sensing raw dynamic data that may be correlated to a gap distance 29 defined between transducer 12 and a conductive or metallic target 30, such as, but, not limited to a rotating shaft of the machine or an outer race of a rolling element bearing being monitored. The electrical impedance measured at the conditioning circuitry is the electrical combination of target 30, transducer 12 including sensing coil 14 and cable 15, an extension cable, if there is one, (not shown) and the circuitry of system 10. This impedance is usually called the "tank impedance" or parallel impedance ($Z_p$).

Digital eddy current system 10 includes a resistor 40 having a resistance value R, and a first terminal 41 and a second terminal 42 which are respectively coupled between a first node 44 and a second node 46.

Transducer 12 has an unknown dynamic transducer impedance having a value $Z_{unknown}$ and is coupled between second terminal 42 of resistor 40 at node 46 and a ground node 48. Accordingly, resistor 40 and transducer 12 form a serial electrical connection.

Digital eddy current system 10 also includes a filter 50, a signal generator 70, a timing control circuit 80, a sampling circuit 90, a convolution circuit 100 and a digital signal processor (DSP) 110. Signal generator 70 is operatively coupled to resistor first terminal 41 at node 44 through filter 50 for driving a signal through resistor 40, and transducer 12 thereby impressing a first voltage $V_1$ across serially connected resistor 40 and transducer 12, and a second voltage $V_2$ only across transducer 12. As used herein, the term "processor" also refers to microprocessors, central processing units (CPU), application specific integrated circuits (ASIC), logic circuits, and any other circuit or processor capable of executing inspection system, as described herein.

In the exemplary embodiment, signal generator 70 is operatively coupled to resistor 40 at node 44 via filter 50 and to digital signal processor (DSP) 110 for driving a programmable dynamic signal of one or more frequencies through filter 50 and the serial connection of the resistor 40/transducer 12 combination. Specifically, signal generator 70 includes a direct digital synthesis (DDS) device 72 that is operatively coupled to resistor first terminal 41 via filter 50 and buffer, gain and offset circuit 60 for driving the dynamic signal or waveform through resistor 40 and transducer 12.

This dynamic signal causes the first voltage $V_1$ to be impressed across the serial connection of resistor 40 and transducer 12 and causes the second voltage $V_2$ to be impressed only across transducer 12. In the exemplary embodiment, transducer sensing element 14 is coupled proximate target 30 such that this dynamic signal causes sensing element 14 to generate an alternating magnetic field that induces eddy currents in the metallic target 30. In turn, the eddy currents in target 30 induce a voltage in sensing element 14 and hence, a change in an impedance of transducer 12 which varies as a function of, for example, variations of gap distance 29 between transducer 12 and target 30.

In the exemplary embodiment, signal generator 70 includes a plurality of DDS devices 72 coupled to resistor first terminal 41 via filter 50 and buffer, gain and offset circuit 60 for driving a plurality of dynamic signals at different frequencies through resistor 40 and transducer 12, and subsequently performing processing including convolution for obtaining simultaneous impedance measurements of transducer 12 at different frequencies which may be correlated to gap distance 29 between transducer 12 and target 30.

Each DDS device 72 may be coupled to DSP 110 via interface 114 and generates a pure frequency/phase-programmable dynamic signal such as a sinusoidal wave. DSP 110 may include an algorithm to program both the frequency and the phase of the output signals which in turn may be used to drive transducer 12 with a frequency/phase-programmable dynamic analog signal having an output frequency/phase which may be precisely manipulated under full digital control. Therefore, each DDS device 72 may be digitally programmed to output sine waves at a plurality of frequencies/phases with precision for use as driving signals or reference signals. In one embodiment, DDS device 72 is a device such as part number AD9850 commercially available from Analog Devices, Norwood, Mass.

Filter 50 is electrically coupled between DDS device 72 and resistor 40 for filtering the analog dynamic signals output from DDS device 72. In the exemplary embodiment, filter 50 includes at least one low pass filter 52 electrically coupled between each DDS device 72 and first terminal 41 of resistor 40 to purify the output dynamic signals or waveforms of each DDS device 72 for eliminating, for example, harmonics created in DDS device 72. For example, as a result of the outputs of DDS devices 72 being ten plus bit digital to analog converters, the quantization noise is filtered out using a low pass filter. Therefore, filters 52 remove the steps and facilitates smoothing out the analog dynamic signal outputs from DDS devices 72. Additionally, filters 52 facilitates reducing the noise bandwidth of the system 10 to improve a signal to noise ratio. In one embodiment, low pass filters 52 are five pole elliptical filter devices.

In the exemplary embodiment, buffer, gain and offset circuit 60 is electrically coupled between filter 50 and resistor 40 for buffering and amplifying the analog dynamic signals and providing any desired offset of the analog dynamic signals. Sampling circuit 90 is coupled to first node 44 for sampling and digitizing voltage $V_1$ impressed across the serially connected resistor 40/transducer 12 combination. Additionally, sampling circuit 90 is coupled to second node 46 for sampling and digitizing voltage $V_2$ that is impressed only across transducer 12. In the exemplary embodiment, sampling circuit 90 includes a pair of analog-to-digital converters (ADC) 92 and 94 coupled to first node 44 and second node 46 respectively for sampling and digitizing the first dynamic voltage $V_1$ and the second dynamic voltage $V_2$. In one embodiment, ADCs 92 and 94 are fourteen bit, wide bandwidth converters such as part number AD6644 commercially available from Analog Devices, Norwood, Mass.

Timing control circuit 80 provides synchronization between the output signal of signal generator 70 and the sampling rate of sampling circuit 90 such that the phase relationship between the output signal and samples is maintained. Timing control circuit 80 is operatively coupled to each DDS device 72, of ADCs 92 and 94, and to DSP 110. Therefore, DDS devices 72 are clocked by timing control circuit 80 such that the frequency of the output of DDS devices 72 is accurately set. Additionally, timing control circuit 80 provides synchronization between the output of DDS devices 72 and the sampling rate of ADCs 92 and 94 such that a phase relationship between the dynamic driving signal(s) and the sampled signals is maintained. Accordingly, sampling may be performed in synchrony with the dynamic driving signals.

Timing control circuit 80 includes a quartz clock oscillator 84 that is operatively coupled to each DDS device 72 for providing a clock signal to each DDS device 72.

DDS device 72 and the ADC's 92 and 94 are also clocked by oscillator 84 to ensure a consistent phase between signal generator 70 and sampling circuit 90.

Convolution circuit 100 may be a stand-alone device in the form of, for example, a digital down counter (DDC). In the exemplary embodiment, convolution circuit 100 is coupled between sampling circuit 90 and DSP 110 to do the convolution operation. Analog-to-digital converted voltages $V_{1D}$ and $V_{2D}$ are received and convolved by convolution circuit 100 and then transmitted to DSP 110 as complex voltage numbers $V_{1C}$ and $V_{2C}$. Convolution circuit 100 may be programmed to process a predetermined frequency. In one embodiment, convolution circuit 100 is a digital down counter (DDC) such as part number HSP 50216, commercially available from Intersil Corporation, Milpitas, Calif.

In an alternative embodiment, digital convolution circuit 100 is integrally formed with digital signal processor 110 wherein DSP 110 is operatively coupled to ADCs 92 and 94 for receiving the first and second digitized voltage signals $V_{1D}$ and $V_{2D}$ from ADCs 92 and 94 and convolving the digitized voltages into respective complex voltage numbers $V_{1C}$ and $V_{2C}$ via integral convolution circuit 100. A DSP 110 having an integral convolution circuit 100 such as the 210XX series of devices is commercially available from Analog Devices, Norwood, Mass. The process of convolving the digitized voltages into respective complex voltage numbers $V_{1C}$ and $V_{2C}$ via convolution circuit 100 is defined as in-phase and quadrature detection or quadrature synthesis. The calculated impedance may be converted by the processor 110 into a voltage or gap value correlative to the gap distance 29 between transducer 12 and target 30 being monitored by using equation(s), algorithms, numerical methods or lookup tables stored in, for example, a memory 120 coupled to processor 110. The impedance or gap values may be outputted via a digital-to-analog converter 140 to an analog output 142. Analog output 142 may include, for example, alarms, relays, and circuit breakers that may be set to trip when the analog output is outside a predetermined nominal operating range.

The impedance or gap values may be outputted through a communications link 144 to a host computer 146 for further processing for the use of monitoring rotating or reciprocating machinery. An input 148, such as, but not limited to a keyboard, a pointing device, a voice command circuit and/or touch screen may be used to input data or modify settings of system 10 through a menu driven interface which may be viewed on a display 150. The input data may be used immediately in calculations or may be stored in memory 120 for later use. Display 150 may include, for example, a CRT or LCD monitor, and/or hardcopy device.

In operation, a radio frequency (RF) signal is transmitted from transducer coil 14 such that an RF field is created around the transducer tip. In the exemplary embodiment, the RF field extends to a gap distance 29 greater than approximately 0.1 inches (100 mils). When target 30 is present in the RF field, eddy currents flow in the surface of target 30. A penetration depth of the eddy currents depends on a conductivity and permeability of target 30. For example, the penetration depth of E4140 steel is approximately 0.003 inches (3 mils). When transducer 12 is close enough to target 30 to cause eddy currents to flow in target 30, the RF signal is affected, in that, the RF signal amplitude is at a minimum when gap distance 29 between transducer 12 and target 30 is at a minimum, resulting in a maximum of eddy current flow in target 30. Similarly, the RF signal amplitude is at a maximum when gap distance 29 between transducer 12 and target 30 is at a maximum, resulting in a minimum of eddy current in target 30. Additionally, when target 30 is moving slowly within the RF field, the RF signal amplitude increases or decreases slowly. If the target is moving rapidly within the RF field, the RF signal amplitude increases or decreases rapidly. Oscillatory movement of target 30 causes the RF signal to modulate, such as when target 30 is vibrating in relation to transducer 12.

Figure 2:
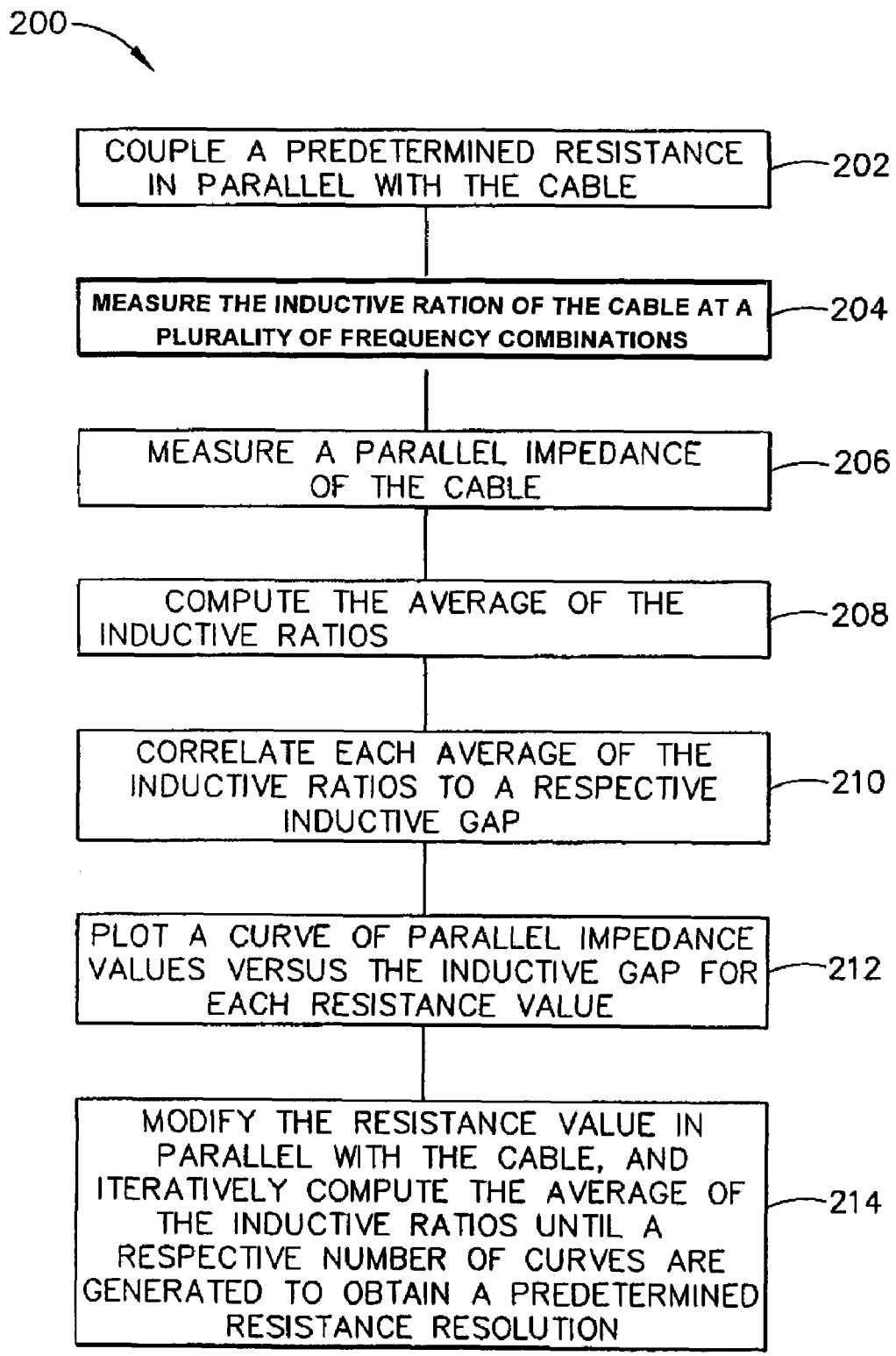
FIG. 2 is a block diagram of an exemplary method of generating a look-up table.

FIG. 2 is a block diagram of an exemplary method 200 of generating a look-up table of parallel impedance versus inductive gap. The method includes coupling 202 a predetermined resistance in parallel with cable 15. The resistance may simulate an effect of fluid intrusion into cable 15. In the exemplary embodiment, the resistance represents the effect of water wetting cable 15. In other embodiments, the fluid may be, for example, but not limited to, oil, hydraulic fluid, or a solvent. An inductive ratio of cable 15 is measured 204 at a plurality of frequency combinations, wherein each combination includes two different frequencies. In the exemplary embodiment, system 10 is configured to drive transducer 12 at three different frequencies, each frequency being generated by a different programmable DDS 72. For example. in the exemplary embodiment, the frequency combinations used to measure the inductive ratio are the first and second. second and third, and third and first frequencies. Substantially simultaneously with the inductive ratio measurement 204, system 10 also measures 206 a respective parallel impedance of cable 15. The inductive ratio measured at each frequency combination is used to compute an average of the inductive ratios 208. The average inductive ratio is correlated 210 to an inductive gap value. Each measurement may be plotted 212 such that a curve of respective parallel impedance values versus the corresponding inductive gap is defined. In one embodiment, the results of each computation are plotted on display 150 in a textual format. In the exemplary embodiment, the results are displayed in a graphical format.

The resistance value in parallel with cable is then modified 214 to simulate a different level of fluid intrusion into cable 15. The measurements and computations are implemented iteratively to generate a series of curves that are relative to parallel impedance and inductive gap. The number of iterations may be preselected based upon user preferences or may be preselected based on desired level of resistance resolution between respective curves.

In operation, an initial step of the inductive ratio measurement is to measure the impedance of cable 15 and transducer 12 at two different frequencies $f_1$ and $f_2$. Thus, the impedance at $f_1$ is $X_1=(R_1+j\omega L_1)$ and the impedance at $f_2$ is $X_2=(R_2+j\omega L_2)$. Next, the instant invention assumes that the impedance of the far gap 29 at $f_1$ is $r_1+j\omega l_1$ and the impedance of the far gap at $f_2$ is $r_2+j\omega l_2$. Then, the normalized impedance is calculated as follows:

$$\text{For } X_1: R_1 n = (R_1-r_1)/\omega_1 l_1, \quad \omega_1 L_1 n = \omega_1 L_1/\omega_1 l_1$$

$$\text{For } X_2: R_2 n = (R_2-r_2)/\omega_2 l_2, \quad \omega_2 L_2 n = \omega_2 L_2/\omega_2 l_2$$

Because fluid intrusion affects the resistance of cable 15, making the resistance unreliable, and has minimal affect to the inductance of the cable 15/transducer 12 combination, the focus will be on the reactance measurement. In addition, with transducer 12 and cable 15 remaining installed in the machine, the far gap is unknown and as a result, $\omega_1 L_1 n$ and $\omega_2 L_2 n$ can not be calculated because $l_1$ and $l_2$, the inductances at far gap, are unknown. However, a function can be defined to remove the unknown variables. Specifically, if a function is defined to equal a normalized reactance at $f_1$ divided by a normalized reactance at f2 the unknowns can be made to cancel out of the equation. This function can be defined as, for example, an inductive ratio function, $\gamma$ (gamma). Therefore, $\gamma=(\omega_1 L_1 n/\omega_2 L_2 n)$ and from the equations for X1 and X2 hereinabove we have the following:

$$(\omega_1 L_1 n/\omega_2 L_2 n) = (\omega_1 L_1/\omega_1 l_1)/(\omega_2 L_2/\omega_2 l_2) \text{ and thus,}$$

$$(\omega_1 L_1 n/\omega_2 L_2 n) = (\omega_1 L_1/\omega_2 L_2) * (\omega_2/\omega_1) * (l_2/l_1),$$

wherein the first term on the fight side of the equation can be measured by system 10; the second term is the known frequencies and the third term is the inductances at far gap which changes very little over frequency and therefore may be approximated as equaling one. The advantage of the inductive ratio method is that many of the variables that affect the impedance measurement are eliminated using this method. Some of the variables eliminated are: the probe resistance, the probe inductance, the value of the known resistance in the detector, the voltage magnitude and phase driven into the known resistor and the reference driving the analog to digital converters. This method can be used to detect the degree of fluid contamination or intrusion into cable 15.

Figure 3:
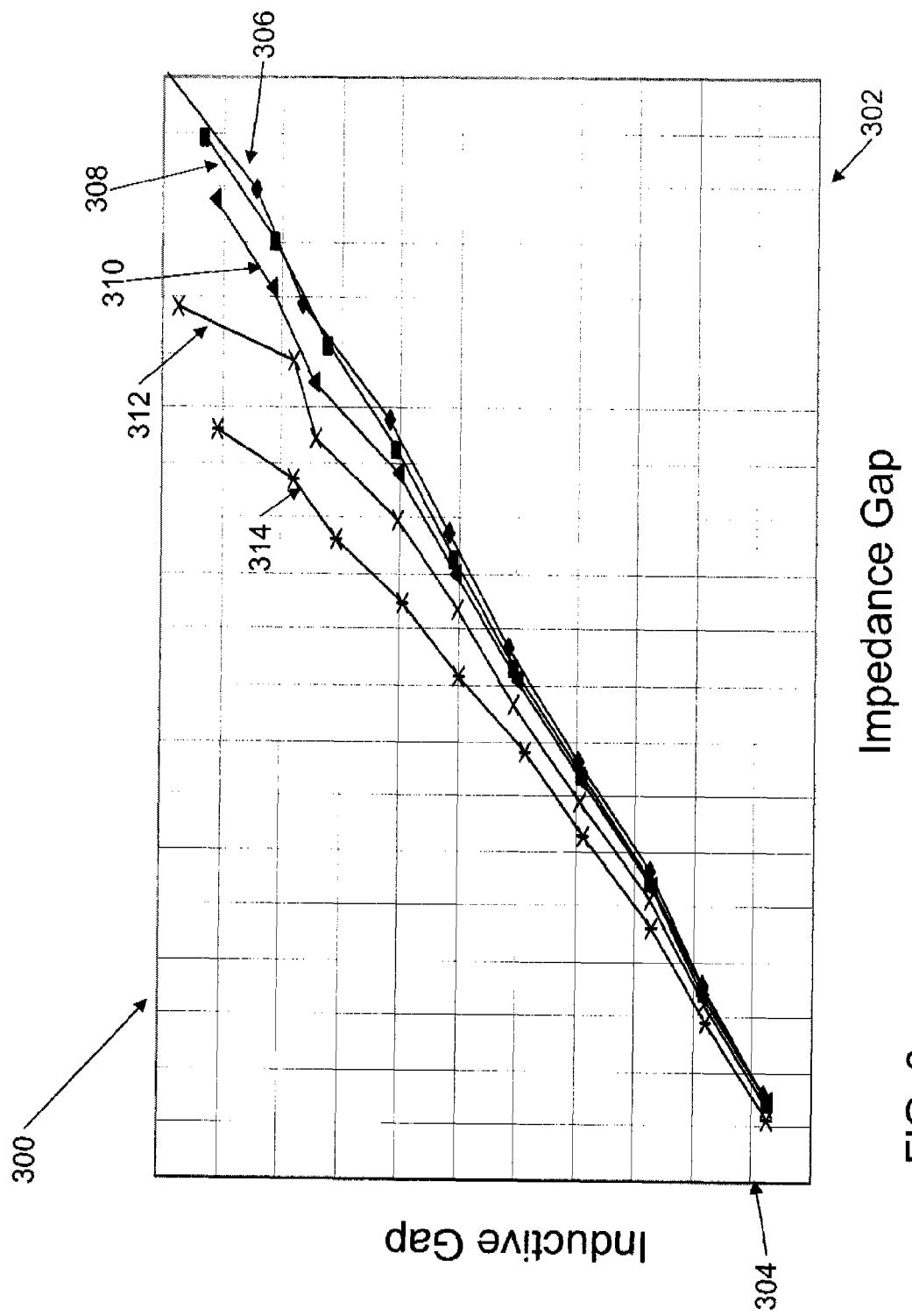
FIG. 3 illustrates an exemplary look-up table of parallel impedance gap versus inductive gap that may be generated using the method shown in FIG. 2.

FIG. 3 illustrates an exemplary look-up table 300 of parallel impedance gap versus inductive gap that may be generated using method 200 (shown in FIG. 2). Table 300 includes an x-axis 302 that represents parallel impedance gap in units of distance, for example, mils, and a y-axis 304 that represents inductive gap in units of distance. Table 300 includes a plurality of curves that define a response of cable 15 and transducer 12 to an average of three different excitation frequencies and at a plurality different parallel impedance gaps. Trace 306 represents a curve plotted without resistance added in parallel with cable 15. This represents a relatively dry cable condition, such as, without fluid intrusion into cable 15 or transducer 12. Trace 308 represents a curve plotted with approximately 400 kΩ of resistance added in parallel with cable 15. Trace 310 represents a curve plotted with approximately 200 kΩ of resistance added in parallel with cable 15. Trace 312 represents a curve plotted with approximately 100 kΩ of resistance added in parallel with cable 15. Trace 314 represents a curve plotted with approximately 49.9 kΩ of resistance added in parallel with cable 15. Table 300 may be used in conjunction with present readings of parallel impedance gap. Each resistance value represents a different level of fluid intrusion into cable 15.

In operation, transducer 12 may be installed in a machine and cable 15 and/or transducer 12 may be suspected of having fluid intrusion affecting the gap measurement of system 10 due to an erroneous resistive term of the impedance, which results in an erroneous parallel impedance measurement. It may be difficult to normalize the measurement data because it may be disadvantageous to remove transducer 12 from the machine in order to get a far gap reading. Determining gap 29 using an inductive ratio and a look-up table of values permits accurate gap measurement without using a suspect resistance portion of the impedance, and a far gap normalizing measurement. In the exemplary embodiment, a look-up "reactance" table includes reactance values for a given gap at three separate frequencies simultaneously. In an alternative embodiment, the look-up table includes reactance values for a given gap at other than three separate frequencies simultaneously. Using a plurality of frequency for the measurement allows more accuracy by creating ratios between the reactance portions of each measurement, which further may be averaged before being applied to the look-up table to determine a corresponding gap value. Another benefit of creating a multi-frequency measurement is that it is possible to compare a parallel impedance value with a plurality of ratio values simultaneously in real-time. As used herein, real-time refers to outcomes occurring at a substantially short period after a change in the inputs affecting the outcome. The period is the amount of time between each iteration of a regularly repeated task. Such repeated tasks are called periodic tasks. The time period is a design parameter of the real-time system that may be selected based on the importance of the outcome and/or the capability of the system implementing processing of the inputs to generate the outcome.

Figure 4:
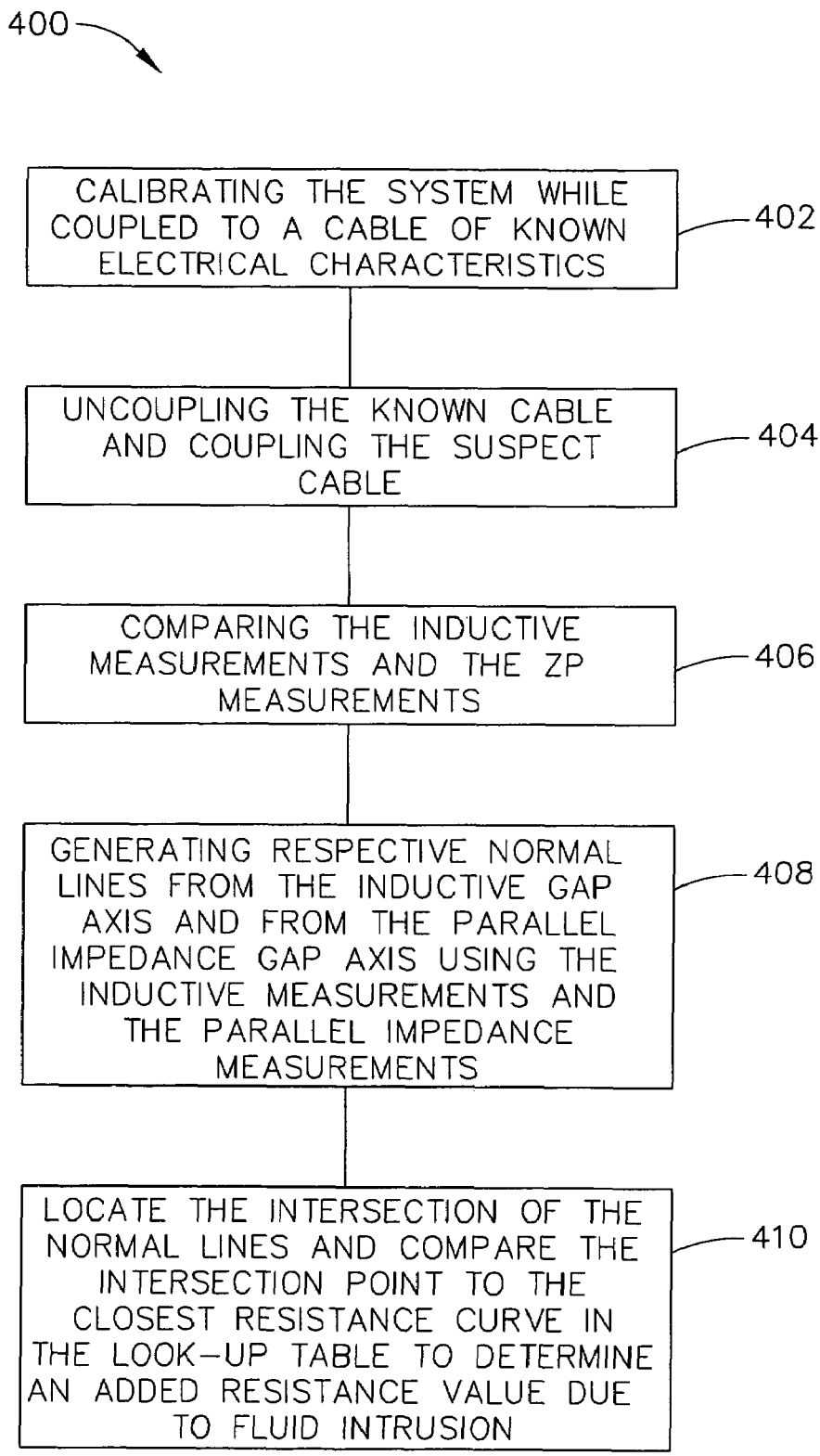
FIG. 4 is a block diagram of an exemplary method 400 of testing a cable using inductive ratio.

FIG. 4 is a block diagram of an exemplary method 400 of testing a cable using inductive ratio. Method 400 includes calibrating 402 the digital proximity system using known calibration procedures for the system and wherein a cable of known electrical characteristics is coupled to the system during the calibration. The known cable is then uncoupled 404 and the suspect cable is coupled 404 to the system. A plot of parallel impedance gap versus inductive gap is generated from predetermined data and compared 406 to the inductive gap measurements and the parallel impedance gap measurements. A line normal to x-axis 302 (shown in FIG. 3) is generated 408 at the parallel impedance gap value measured for the suspect cable. A line normal to y-axis 304 (shown in FIG. 3) is generated 408 at the inductive gap value measured for the suspect cable. The intersection of the normal lines is located 410 and the point of intersection is compared to curves 306, 308, 310, 312, and 314 to determine a closest curve to the intersection point. The resistance value used to generate the curve corresponds to the resistance of the cable due to fluid intrusion into the cable. The resistance in the cable may be a measurement of the cable's operational performance. In the exemplary embodiment, method 400 is automated by a processor programmed to control system 10 to perform method 400. In another exemplary embodiment, the functions of method 400 are implemented on dedicated hardware such as, but not limited to, an Application Specific Integrated Circuit (ASIC) or a digital signal processor (DSP). As used herein, the term "processor" is not limited to just those integrated circuits referred to in the art as processors, but broadly refers to computers, microcontrollers, microcomputers, microprocessors, central processing units (CPU), programmable logic controllers, application specific integrated circuits, and other programmable circuits, logic circuits, and any other circuit or processor capable of the functions described herein, and these terms are used interchangeably.

The above-described methods and system provide a cost-effective and reliable means for measuring fluid intrusion or contamination of a cable, for example, a digital proximity system cable. More specifically, the methods and system facilitate utilizing an eddy current proximity system to measure a resistance added to the cable due to fluid intrusion. As a result, the methods and system described herein facilitate monitoring equipment in a cost-effective and reliable manner.

While the present invention is described with reference to measuring fluid intrusion into a digital eddy current proximity system cable, numerous other applications are contemplated. For example, it is contemplated that the present invention may be applied to any system wherein a cable may be influenced by fluid intrusion into the cable, such as, but not limited to, electrical distribution systems, process measurement systems and instrumentation systems.

Exemplary embodiments of digital eddy current proximity systems are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. A method of testing a digital proximity system transducer cable for fluid intrusion, said method comprising:
    determining at least three inductive ratio values for the cable, each inductive ratio value measured at a first excitation frequency and at a second excitation frequency that is different from the first excitation frequency;
    averaging the inductive ratio values;
    determining an inductive gap from an average of the inductive ratio values;
    measuring a parallel impedance of the cable substantially simultaneously with measuring the inductive ratio values;
    correlating a parallel impedance of the cable to a parallel impedance gap;
    plotting a look-up table of the inductive gap versus a respective parallel impedance gap for viewing by an operator; and
    determining a resistance of the cable based on the inductive gap and the parallel impedance gap using the look-up table, the resistance being indicative of an amount of fluid intrusion into the cable.

2. A method in accordance with claim 1 wherein locating a resistance value using a look-up table comprises locating the resistance value using a look-up table of inductive gap versus parallel impedance gap.

3. A system for testing a cable, said system comprising:
an eddy current transducer positioned in RF communication with a target, said transducer configured to generate an output signal relative to a gap distance; and
a digital impedance measurement system configured to receive the output signal through a cable that is coupled in series with said transducer, said system further configured to measure three inductive ratios for the cable and transducer series combination using at least three different frequencies, said system comprising a memory that includes information that is relative to an inductive gap measurement and a parallel impedance gap measurement.

4. A system in accordance with claim 3 wherein said system is configured to measure the inductive ratio for said cable and transducer combination using three different predetermined frequencies.

5. A system in accordance with claim 3 wherein said system is configured to measure the inductive ratio for said cable and transducer combination substantially simultaneously with measuring a parallel impedance of said cable and transducer combination.

6. A system in accordance with claim 3 wherein said system is configured to average the three inductive ratios.

7. A system in accordance with claim 3 wherein said system is further configured to determine the cable resistance value by using a look-up table.

8. A system in accordance with claim 7 wherein said system is configured to locate the resistance value using a look-up table of inductive gap versus parallel impedance.

9. A system in accordance with claim 8 wherein the look-up table is empirically derived and wherein said system is configured to:
determine a first look-up table curve using a first predetermined resistance coupled in circuit parallel with the cable;
determine a second look-up table curve using a second predetermined resistance coupled in circuit parallel with the cable wherein the second resistance is different than the first resistance;
correlate an average of the cable inductive ratios to a look-up table inductive gap;
correlate a parallel impedance of the cable to a look-up table parallel impedance; and
determine a cable resistance based on the look-up table.

10. A system in accordance with claim 3 wherein said system is a digital proximity system, said target is a rotatable shaft of a rotary machine, said system further configured to determine an amount of fluid intrusion into the cable while said transducer remains installed in the machine and said cable remains coupled to said transducer.

11. A system in accordance with claim 3 comprising a display, said display configured to output a representation of the information that is relative to an inductive gap measurement and a parallel impedance gap measurement.

12. A system in accordance with claim 3 comprising a display, said display configured to output a graphical representation of the information that is relative to an inductive gap measurement and a parallel impedance gap measurement.

* * * * *